US006590382B2

(12) United States Patent
Angelotti et al.

(10) Patent No.: US 6,590,382 B2
(45) Date of Patent: Jul. 8, 2003

(54) SIGNAL PIN TESTER FOR AC DEFECTS IN INTEGRATED CIRCUITS

(75) Inventors: Frank W. Angelotti, Rochester, MN (US); Louis B. Bushard, Rochester, MN (US); Matthew S. Grady, Burlington, VT (US); Scott A. Strissel, Byron, MN (US)

(73) Assignee: International Business Machines Corp., Armonk, NY (US)

( * ) Notice: Subject to any disclaimer, the term of this patent is extended or adjusted under 35 U.S.C. 154(b) by 107 days.

(21) Appl. No.: 09/747,902

(22) Filed: Dec. 22, 2000

(65) Prior Publication Data

US 2002/0079880 A1 Jun. 27, 2002

(51) Int. Cl.[7] ............................................. G01R 31/26
(52) U.S. Cl. ..................................... 324/158.1; 324/765
(58) Field of Search ............................. 324/765, 158.1; 714/718, 726; 702/117, 118, 120, 121, 124

(56) References Cited

U.S. PATENT DOCUMENTS 5,253,255 A * 10/1993 Carbine ...................... 714/734
6,058,496 A    5/2000 Gillis et al. ................. 714/727
6,072,737 A *  6/2000 Morgan et al. .............. 365/201

OTHER PUBLICATIONS

IBM Technical Disclosure Bulletin, vol. 34, No. 4A, pp. 230–232, Sep. 1991, entitled: Latched I/O Ac Test Using A Reduced Pin Boundary Scan Logic Test Method,.

* cited by examiner

Primary Examiner—Kamand Cuneo
Assistant Examiner—Russell M. Kobert
(74) Attorney, Agent, or Firm—Francis J. Thornton; Robert A. Walsh

(57) ABSTRACT

A test apparatus and a method for testing an integrated circuit's data storage device's input/output signal pins for alternating current (AC) defects, by providing an interface that will couple each respective individual test contact, in a subset of said contacts, to a select plurality of the data storage input/output signal pins so that when a selected data string is introduced into the integrated circuit so that each input/output pin on a data storage device in the integrated circuit will be tested in sequence whereby the number of contacts required by the tester can be reduced.

2 Claims, 4 Drawing Sheets

|  | 21A | 21B | 21C | 21D |
|----|-----|-----|-----|-----|
| t0 | 0 | 0 | 0 | 0 |
| t1 | 1 | 0 | 0 | 0 |
| t2 | 1 | 1 | 0 | 0 |
| t3 | 1 | 1 | 1 | 0 |
| t4 | 0 | 1 | 1 | 1 |
| t5 | 1 | 0 | 1 | 1 |
| t6 | 0 | 1 | 0 | 1 |
| t7 | 0 | 0 | 1 | 0 |
| t8 | 0 | 0 | 0 | 1 |
| t9 | 0 | 0 | 0 | 0 |

STATE OF LATCHES
v. CLOCK INTERVALS

SIGNAL PIN TESTER FOR AC DEFECTS IN INTEGRATED CIRCUITS

FIELD OF THE INVENTION

The present invention relates generally to an apparatus and a method for testing integrated circuits comprising functional circuits and data storage circuits. More particularly, the present invention is directed to a test apparatus and a method for testing an integrated circuit that has a scan-based interface by which data can be shifted through a chain of clocked storage devices and extracted sequentially therefrom to test the device data storage device's input/output (I/O) signal pins for alternating current (AC) defects.

BACKGROUND OF THE INVENTION

The present invention generally relates to integrated circuits containing data storage circuits and functional circuits all of which are coupled to other components, external to the integrated circuit, through signal interface pins. A small number of these signal interface pins are coupled only to the functional circuits and are used to provide necessary control functions, such as clock pulses, test modes, test control data, and etc. to the integrated circuit. The remaining signal interface pins are used to transfer data into and out of the data storage circuits contained in the integrated circuit.

At times, a signal interface or input/output pin, used to transfer data into or out of the data storage circuits, will function correctly in a direct current (DC) mode, that is, it will carry the proper current but will have resistive, inductive or capacitive aspects that affect the alternating current (AC) characteristics, i.e., the rise and fall times of signals passing through the pin. These AC characteristics, by delaying or skewing the shift time of these signals, causes the rise or fall time of the signals to be altered, i.e., to be slower than that called for in the circuit specification. To assure the final quality of the integrated circuit such AC defects must be ascertained by rigorous and extensive testing of the integrated circuit.

At the present time, such AC defect testing requires the use of high frequency automated test equipment (ATE) that provides a tester contact for each signal interface pin on the integrated circuit, i.e., for both functional circuit pins and data storage pins.

Testers having sufficient test contacts for large integrated circuits are expensive to purchase and newer integrated circuits are now being introduced with even higher storage data capacity and thus more input/output pins. The introduction of integrated circuits with more input/output pins means that manufacturers must either upgrade their old testers or purchase new testers.

Thus as integrated circuits continue to increase in pin count and become faster, it becomes increasingly expensive for manufacturers to provide automated test equipment that can speedily test the newer, larger signal pin count, integrated circuits.

Therefore, there is a compelling economic reason to extend the life of the present testers by providing a way to utilize presently available test equipment to test the newer, larger storage capacity, integrated circuits.

It also becomes desirable that means be found to test the newer, large storage capacity, integrated circuits with presently available testers.

SUMMARY OF THE PRESENT INVENTION

The present invention is directed to an apparatus and a method of testing of integrated circuits having a high input/output pin count with an automated test equipment (ATE) having fewer contacts than there are input/output pins on the integrated circuit.

The present invention accomplishes this desirable result by providing a unique device interface board (DIB), between the device under test (DUT) and the tester. This device interface board is arranged to provide direct coupling between each respective tester contact in a first set of selected tester contacts and each respective functional circuit pin on the DUT and to further couple each respective remaining test contact to the input/output pins of a respective chain of serially arranged data storage circuits.

In this way, the present invention permits testing of an integrated circuit having a multiplicity of input/output pins greater than the contacts on the tester.

The present invention, by providing an interface for coupling each respective individual test contact, in a subset of said contacts, to a select plurality of the data storage input/output signal pins and introducing a selected data string into the integrated circuit, tests each data storage device input/output pin in the integrated circuit in sequence even though the number of contacts on the tester is less than the number of input/output pins to be tested.

These objects, features and advantages of the present invention will be further apparent to persons skilled in the art from the following detailed description taken in conjunction with the accompanying drawings wherein:

DESCRIPTION OF THE PREFERRED EMBODIMENT

Referring now to FIGS. 1 through 4, the present invention will be described in detail.

Figure 1:
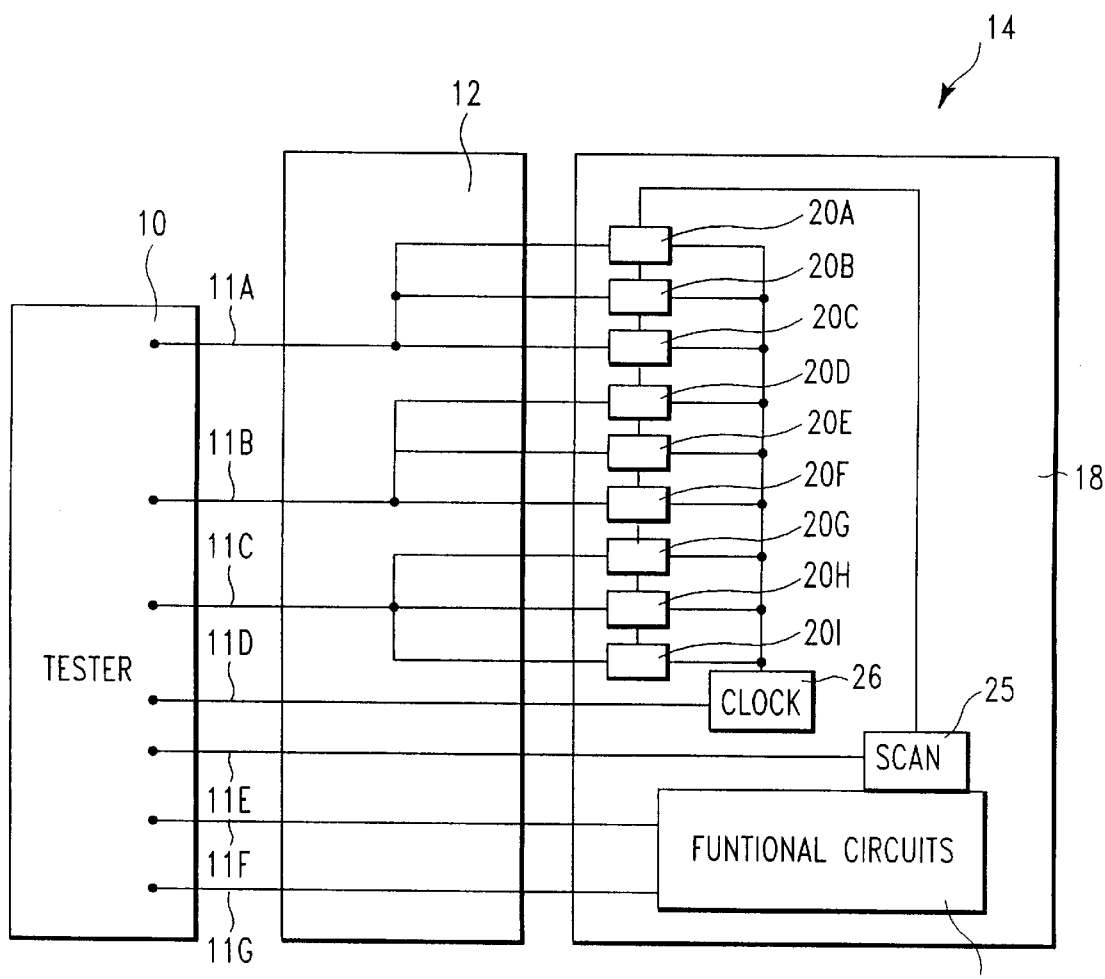
FIG. 1 is a block diagram of an integrated circuit coupled to a tester in accordance with the present invention.

FIG. 1 is a block diagram of a tester 10 having a plurality of test contacts of which only a few, 11A, 11B, 11C, 11D, 11E, 11F, and 11G, are shown coupled, via a device interface board or DIB 12, to a device under test 14. In the present invention, the DUT 14 is an integrated circuit having a scan-based interface. Many such scan based integrated circuits presently exist and are well known to the art. A scan based, integrated circuit is one in which data can be sequentially shifted through a chain of clocked signal storage devices or latches forming the data storage circuits. Typically such integrated circuits comprise a controller 16 and a data storage circuit area 18. The controller 16, as is well known to the art, comprises a plurality of functional circuits, e.g., clocks, test control circuits and etc. In data storage area 18 there is provided a plurality of data storage devices 20A, 20B, 20C, 20D, 20E, 20F, 20G, 20H and 20I. Each of these data storage devices is coupled to a respective input/output pin.

The test contacts 11A, 11B, 11C, 11D, 11E, 11F, and 11G are coupled to the data interface board (DIB) 12 which is provided with circuitry or wiring that will couple the test contacts 11D, 11E, 11F, and 11G to the circuits in the controller portion 16 of integrated circuit 14 and to respectively couple, in parallel, each of the test contacts 11A, 11B, and 11C to the input/output pins of selected pluralities of the data storage devices 20A, 20B, 20C, 20D, 20E, 20F, 20G, 20H and 20I.

Typically this interface board is a printed circuit provided with a plurality of sockets for receiving the input/output pins of the integrated circuit and these sockets are wired to means, on the board, that will provide connections to selected ones of the tester contacts. Of course, as is well known to the art, the board need not be a printed circuit and many other types of interfaces can be used.

Figure 2:
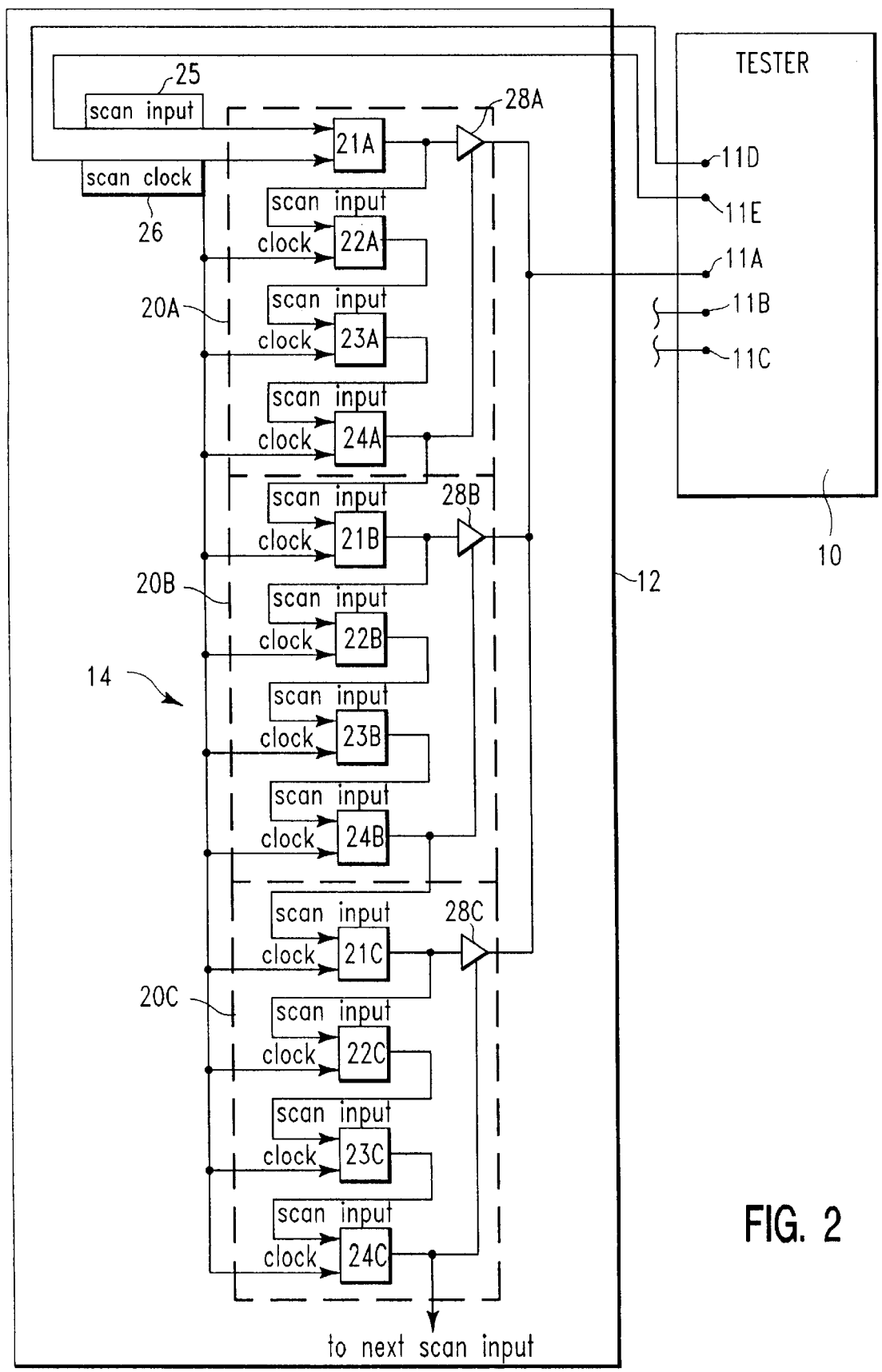
FIG. 2 is a schematic showing a chain of three of the storage driver circuits of FIG. 1 coupled to a single tester contact.

Specifically, in FIG. 2, tester contact 11A is coupled, in parallel, by the data interface board 12 to the input/output pins of the three data storage devices 20A, 20B and 20C, tester contact 11B is similarly coupled, in parallel, to the input/output pins of the three data storage devices 20D, 20E, and 20F, and tester contact 11C is coupled, in parallel, to the input/output pins of the three data storage devices 20G, 20H and 20I.

It should be clearly understood that, although only three such data storage devices are shown connected to a single test contact, additional devices can be so connected.

As noted previously the device interface board not only has a plurality of sockets into which the input/output pins of the data storage devices can be received but also has suitable connectors to connect the wiring on the board to the tester contacts.

Each data storage device 20A, 20B, 20C, 20D, 20E, 20F, 20G, 20H and 20I is identical and stores a single bit of data. Each such data storage device is, for example, comprising a number of serially arranged clocked signal storage devices. Typically such a clocked signal storage device is, a flip-flop circuit or other such latching circuit and will herein after be referred to as a latch.

In general, each data storage device comprises four such clocked signal storage devices, a driver latch having inputs coupled to a scan input and a clock input and an output coupled to a respective input/output pin and as well as through two intermediate latches to an enable latch. The output of the enable latch of the first data storage device is fed back to the enable terminal of the I/O driver connected to the first data storage device as well as to the driver latch in the next following data storage device. The clock input is also directly connected to each of the intermediate latches and to the enable latch.

Specifically, as shown in FIG. 2, storage device 20A comprises driver latch 21A having a first input coupled to a scan circuit 25, second input coupled to a clock 26, and an output coupled to input/output pin 28A. The output of the latch 21A is also coupled through the serially arranged intermediate latches 22A and 23A, to the input of the enable latch 24A. The output of the enable latch 24A is fed back to enable terminal of input/output pin 28A as well as being coupled to the input of the driver latch 21B of the following storage device 20B. As can be seen from FIG. 2 the following storage devices 20B and 20C are similarly arranged in that each comprises a driver latch coupled to a respective input/output pin, two intermediate latches and an enable latch. It is to be noted that only the driver circuits and the enable circuits of each storage device 20A, 20B, and 20C has an output coupled to the respective input/output pins 28A, 28B and 28C.

It is to be understood that the only time a signal is received at a respective input/output pin is when the enable latch receives a "1". When the enable latch receives the "1" the data in the driver latch is sent to the input/output pin coupled to the driver.

Once the described apparatus is arranged as set forth above, it is operated as follows: the tester 10 is energized and the functional circuits 16, and the clock 26 are powered up. This causes the clock 26 to begin running and the clock sends a clock signal simultaneously, to every latch in every data storage device in the integrated circuit. Once the clock 26 has been started, a selected pattern or data stream comprising "1"s and "0"s, is scanned, i.e., fed, into the driver latch 21A of the first data storage device 20A and thence through the other storage devices 20B and 20C.

Since each data storage device operates in a manner identical to every other storage device, only the operation of the first device 20A will be described in detail.

An example of a suitable data stream is:

(Trailing edge of data) 000 . . . 0101110 . . . 000 (Leading edge of data),

The first data bit in this data stream is introduced into the first driver latch 21A by the first clock cycle following the start of the data stream. The next clock shifts this first data bit out of latch 21A into the next latch 22A in the chain. Simultaneously the next bit of data is entered into the driver latch 21A. This sequencing continues until the entire data stream is passed through the entire chain.

It is to be noted that this stream of data has a leading edge formed solely of "0"s, a central portion of "1"s and "0"s and a trailing edge also formed solely of all "0"s. The leading edge of the data, formed only of "0"s, must be sufficiently long enough to scan a "0" into each latch in the entire chain of data storage devices to ensure that all the latches involved are initialized to "0" and all the data input/output pins 28A, 28B and 28C are at a quiescent state "Z" as shown in FIG. 4.

Once all the latches are so initialized, the central portion of the data stream is introduced into latches 21A, 22A, 23A, and 24A associated with data storage device 20A. The table shown in FIG. 3 sets out the state of all the latches 21A, 22A, 23A, and 24A in the data storage device 20A with respect to the clock cycles passing the data through the latches.

Figures 3, 4:
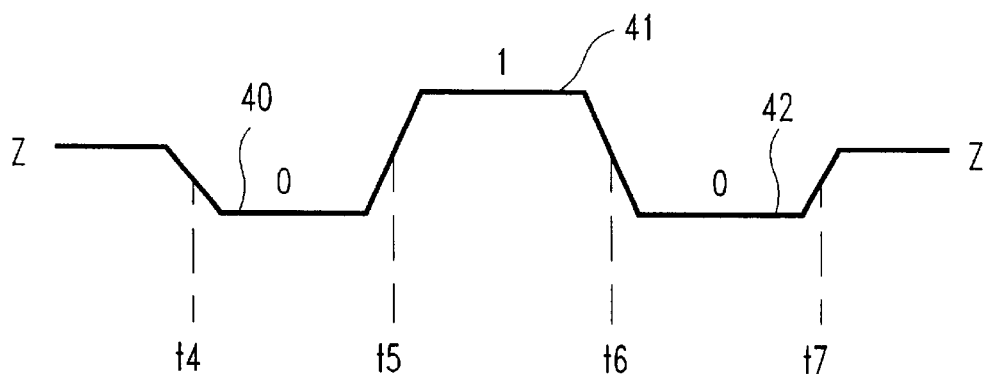
FIG. 3 shows a table depicting the state of each clocked storage device in the first one of the storage driver circuits of FIG. 2 at selected clock intervals.
FIG. 4 is a plot of the output of the first storage driver circuit of FIG. 2 when activated as shown in the table of FIG. 3.

This table shown in FIG. 3 represents the following sequence. At time to all the latches 21A, 22A, 23A, and 24A have all been loaded with "0"s. All the input/output pins 28A, 28B and 28C are all in the quiescent state indicated by "Z" in FIG. 4. At time $t_1$ the first "1" in the sequence has been received by the driver circuit 21A. At time $t_2$ the first "1" previously in the driver latch 21A has been shifted into latch 22a and the second "1" is received by the driver latch 21A. At time $t_3$ the third "1" has been received by the driver latch 21A and the first "1" shifted into the latch 23A and the second "1" shifted into the latch 22A. At time $t_4$ the "0" following the first three "1"s in the sequence is received by the driver latch 21A and all the "1"s are again shifted causing a "1" to appear in latch 22A, latch 23A and the enable latch 24A. The enable circuit 24A is activated by this "1" and the bit of data, i.e., the "0" in the driver latch circuit 21A is sent from of the driver latch 21A to the output 28A and input/output pin 28A falls below the quiescent level "Z" as shown, in FIG. 4, by the negative pulse 40 lying between times $t_4$ and $t_5$. At time $t_5$ a "1" is simultaneously received by both the driver latch 21A and by the enable latch 24A. The "1" in the enable latch causes the "1" in the driver latch to be sent to the input/output pin 28A causing output 28A to rise above the quiescent level "Z". This is shown by the positive pulse 41 between the times $t_5$ and $t_6$. The sequence continues and when, at time $t_6$, the enable latch 24A again receives a "1" and the driver latch 21A again receives a "0" the input/output pin 28A again goes below the quiescent level "Z" and is shown as negative pulse 42. At time $t_7$ the enable circuit again receives a "0" and the enable circuit shuts off returning the pin 28A to the quiescent level "Z".

The other pins 28B and 28C have, of course not yet been activated by the data stream and thus they will remain at a high impedance even though Pin 28A transitions as above described. As the stream passes through in sequence through the data storage devices, 20B and 20C, these data storage devices will in turn display a similar pattern of pulses from which the AC characteristics of the input/output pins 28B and 28C can be determined. In exactly this same way all the input/output pins of all the other data storage devices on the integrated circuit can be sampled.

It should be noted that each of the other tester contacts 11B and 11C can be simultaneously receiving data from other data storage devices to which they are coupled.

Figure 5:
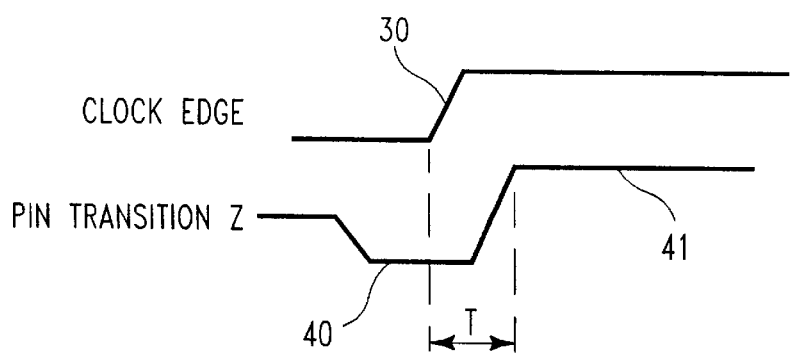
FIG. 5 illustrates the measurement of an input/output pin transition time.

As is well known to the art the tester is programmed to a pass/fail criteria based on the amount of time "T" it takes the input/output pin to transition, i.e., to shift from a low state (0") to a high state ("1") after receipt of the clock pulse initiating the transition. This time "T" is thus shown, in FIG. 5, begins with the start of the clock pulse 30 and ends when the transition between the negative pulse 40 and the positive pulse 41 ends, i.e., when the input/output pin rises to the level of pulse 41. If this time "T" is smaller than the established pass/fail criteria, the part is good, if longer the part is a reject.

The fact that several pins are connected to the same test contact is of no consequence, as only a single pin will be active at a time. Also, because the time between clock transitions is not important, low cost, low speed testers can be used.

Further, by use of the present invention, an integrated circuit having 1000 I/O pins, of which 100 I/O pins are needed to interface with the circuit's functional circuits and the remaining 900 I/O pins are needed to interface with the circuit's data storage devices, a tester having 1000 contacts is no longer required and a tester having but 200 contacts will suffice if a data storage device to test contact ratio of 9 to 1 is selected. This clearly illustrates that the use of the present invention permits the use of a significantly smaller, lower cost tester.

Although the data storage devices 20A, 20B, and 20C, shown in FIG. 2, all contain two intermediate latches between the driver latch and the enable latch, other implementations are possible.

For example, if there are more than 2 intermediate latches between the Driver latch and the Enable latch of a pin, then the pattern must be altered to (Trailing edge of data) 000 . . . 000010XXXX1110000 . . . 000 (Leading edge of data).

This data stream will accomplish the same transitions on a driver latch where the number of fill locations, as indicated by XXXX is equal to the number of intermediate latches minus 2.

Figure 6:
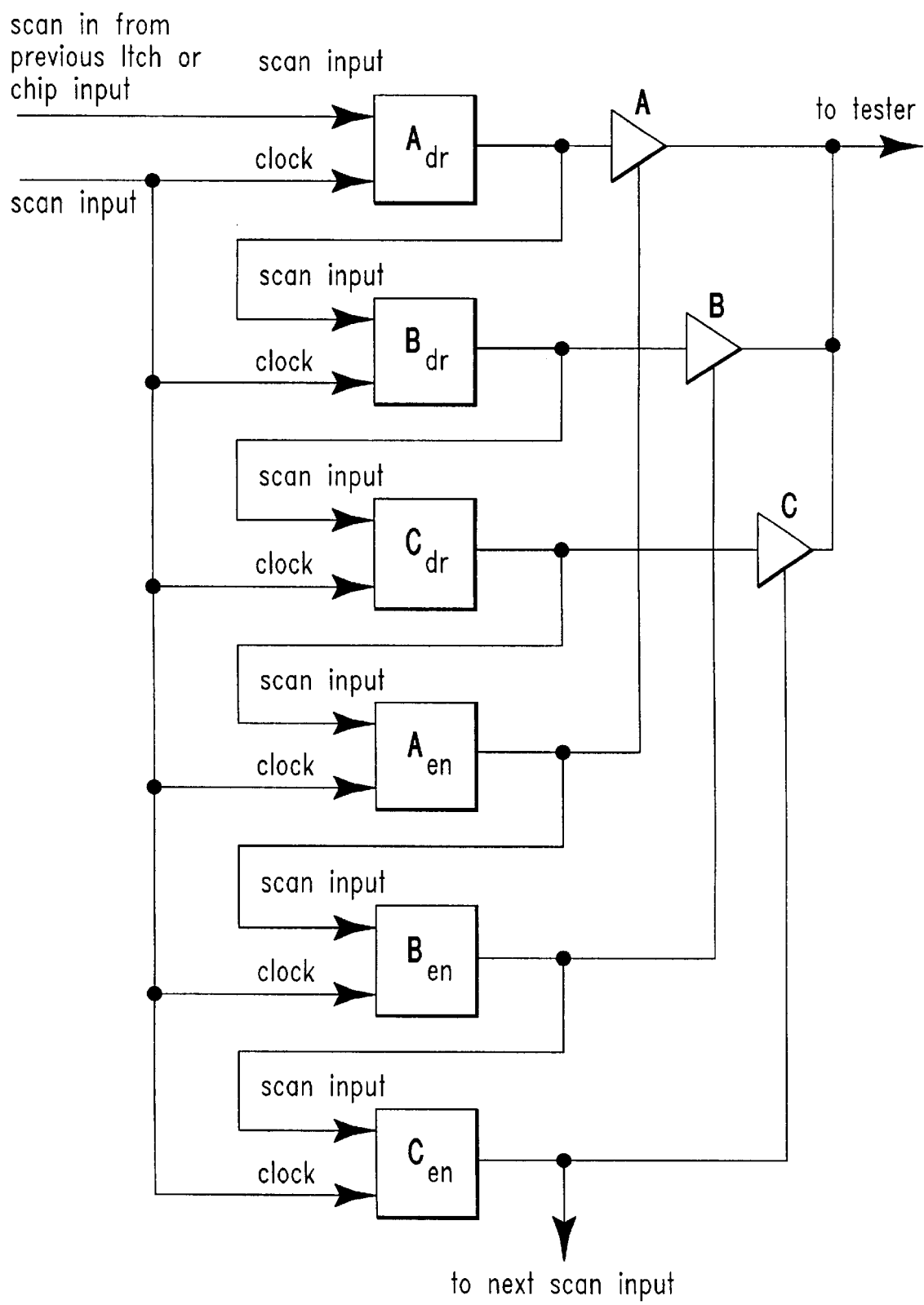
FIG. 6 shows a schematic of another clocked storage device arrangement.

Still further, an implementation that does not require additional latches is possible. One such implementation is shown in FIG. 6. In this FIG. 6 there is shown successive driver-enable latch pairs ($A_{DR}$, $A_{EN}$), ($B_{DR}$, $B_{EN}$), and ($C_{DR}$, $C_{EN}$) interconnected so that the output of latch $A_{DR}$ is fed to latch $B_{DR}$ whose output is fed to latch $C_{DR}$ whose output is fed back to latch $A_{EN}$ whose output is fed back to $B_{EN}$ whose output is fed to $C_{EN}$. This arrangement provides two latches between each driver latch enable latch pair and functions in the same manner as the circuit shown in FIG. 2.

There are other arrangements possible which can provide a reduced level of testing. For example, if no intermediate latches exist between each driver latch and enable latch in a data storage device then the scan pattern (Trailing edge of data) 000 0000110000 000 (Leading edge of data)

will result in an output of which goes from a neutral position to either a high state to a low state on successive drivers, leaving all other drivers at a neutral position.

Further, other alternative embodiments will become apparent to those skilled in the art. For example, by providing a comparator on the DIB amplification (buffering) of the signal received from the Input/output pins can be realized and subsequent measurement, by connection to the tester using comparator time domain or strobing or frequency domain strobing techniques, is possible.

This completes the description of the preferred embodiment of the invention. Since changes may be made in the above construction without departing from the scope of the invention described herein, it is intended that all the matter contained in the above description or shown in the accompanying drawings will be interpreted as illustrative and not in a limiting sense. Thus other alternatives and modifications will now become apparent to those skilled in the art without departing from the spirit and scope of the invention as set forth in the following claims.

What is claimed is:

1. A test apparatus for testing an integrated circuit that has a scan-based interface by which data can be shifted through a chain of clock storage devices and extracted sequentially therefrom to test the device data storage device's input/output (I/O) signal pins for alternating current (AC) defects comprising:

a tester having first and second sets of tester contacts; and an integrated circuit having a set of functional circuits, a scan circuit having an output, a clock circuit having an output and at least three clocked data storage devices arranged in a series;

first means for coupling said set of said functional circuits to a respective tester contact in said first set of tester contacts;

second means for coupling a respective contact in said first set of tester contacts to said clock circuit, and third means for coupling each respective tester contact in said second set of tester contacts to a selected plurality of said clocked data storage devices;

each of said clocked data storage devices being comprised of at least three driver circuits in series;

each of said driver circuits in each of said clock data storage devices having a clock input, a scan input and a scan output;

the clock input of each of said driver circuits being coupled to the output of said clock circuit;

the scan input of the first driver circuit in the first clocked data storage device in said series being coupled to the output of said scan circuit, to the scan output of said first clock data storage device in series, to the tester and to the scan input of the driver circuit immediately following said first driver circuit in said series;

the scan output of each subsequent driver circuit in said series being coupled to the scan input of the following driver circuit in the series;

the scan output of the last data driver circuit in said series being coupled to the tester and to the next data storage device in said series;

the scan output of each subsequent data storage device in said series being coupled to the tester and to the scan input of the following data storage device in the series; and the scan output of the last data storage device in said clocked data storage device being coupled to the tester.

2. A semiconductor test apparatus for testing the data storage device's input/output signal pins of an integrated circuit for alternating current (AC) defects comprising;

a tester having a first and second sets of test contacts thereon;

an integrated circuit having a plurality of data storage latches, a clock circuit, a scan circuit and a circuit block containing selected functional circuits coupled to said data storage latches;

said first set of test contacts containing a number of contacts which is less than the number of said data storage latches;

each of said data storage latches in said integrated circuit having input and output signal pins;

a first test contact in said first set of test contacts being coupled, in parallel, to the input/output pins of a first respective selected number of said data storage latches;

a second test contact in said first set of test contacts being coupled, in parallel, to the input/output pins of a second respective selected number of said data storage latches;

a first respective test contact of second set of test contacts being coupled to the functional circuit block on said integrated circuit;

a second respective test contact of second set of test contacts being coupled to the scan circuit on said integrated circuit; and a third respective test contact of second set of test contacts being coupled to the clock circuit on said integrated circuit.

* * * * *